(12) United States Patent
Onishi et al.

(10) Patent No.: US 9,337,773 B2
(45) Date of Patent: May 10, 2016

(54) OSCILLATION DEVICE AND ELECTRONIC APPARATUS

(75) Inventors: Yasuharu Onishi, Kanagawa (JP); Yuichiro Kishinami, Kanagawa (JP); Jun Kuroda, Kanagawa (JP); Yukio Murata, Kanagawa (JP); Shigeo Satou, Kanagawa (JP); Motoyoshi Komoda, Kanagawa (JP); Nobuhiro Kawashima, Kanagawa (JP); Tatsuya Uchikawa, Kanagawa (JP)

(73) Assignee: NEC CORPORATION, Tokyo (JP)

(*) Notice: Subject to any disclaimer, the term of this patent is extended or adjusted under 35 U.S.C. 154(b) by 31 days.

(21) Appl. No.: 13/994,333

(22) PCT Filed: Nov. 25, 2011

(86) PCT No.: PCT/JP2011/006572
§ 371 (c)(1),
(2), (4) Date: Jun. 14, 2013

(87) PCT Pub. No.: WO2012/090383
PCT Pub. Date: Jul. 5, 2012

(65) Prior Publication Data
US 2013/0307633 A1 Nov. 21, 2013

(30) Foreign Application Priority Data
Dec. 28, 2010 (JP) ................. 2010-291873

(51) Int. Cl.
*H03B 5/30* (2006.01)
*H03B 5/32* (2006.01)
*H04M 1/03* (2006.01)
(Continued)

(52) U.S. Cl.
CPC . *H03B 5/32* (2013.01); *H04M 1/03* (2013.01); *H04R 17/00* (2013.01); *H04M 1/18* (2013.01);
(Continued)

(58) Field of Classification Search
CPC ............... H04R 17/00; H04R 2217/00; H04R 2499/11; H04R 31/006; H04R 2217/03; H04R 1/023; H03B 5/32; H04M 1/03; H04M 1/18
USPC ....... 331/73, 116 M, 154, 155; 367/155, 157, 367/180; 381/150, 190, 191, 431
See application file for complete search history.

(56) References Cited

U.S. PATENT DOCUMENTS 5,357,578 A  10/1994  Taniishi
7,382,079 B2  6/2008  Kawase et al.
(Continued)

FOREIGN PATENT DOCUMENTS

CN  1929700  3/2007
CN  101729972  6/2010
(Continued)

OTHER PUBLICATIONS
International Search Report, PCT/JP2011/006572, Jan. 31, 2012.
(Continued)

*Primary Examiner* — Richard Tan
(74) *Attorney, Agent, or Firm* — Young & Thompson

(57) ABSTRACT

An oscillation device (electro-acoustic transducer (100)) includes an oscillation element (110) that has a vibrating member (120) and a piezoelectric element (111) that is attached to one surface of the vibrating member (120). The oscillation device includes a sheet-shaped waterproof member (140) that is constituted by a waterproof material. The oscillation device includes a frame-shaped supporting member (130) that holds an outer peripheral portion of the vibrating member (120) and an outer peripheral portion of the waterproof member (140) so that the waterproof member (140) and the oscillation element (110) face each other. The oscillation device includes a connection member (150) that partially connects mutual opposed surfaces of the oscillation element (110) and the waterproof member (140).

9 Claims, 5 Drawing Sheets

(51) Int. Cl.
  *H04R 17/00* (2006.01)
  *H04M 1/18* (2006.01)
  *H04R 1/02* (2006.01)
  *H04R 31/00* (2006.01)

(52) U.S. Cl.
  CPC ............... *H04R 1/023* (2013.01); *H04R 31/006* (2013.01); *H04R 2217/03* (2013.01); *H04R 2499/11* (2013.01)

(56) References Cited

U.S. PATENT DOCUMENTS

| | | | |
|---|---|---|---|
| 2007/0057601 | A1 | 3/2007 | Kawase et al. |
| 2007/0108874 | A1 | 5/2007 | Okazaki et al. |
| 2010/0024198 | A1* | 2/2010 | Chen et al. .................. 29/594 |
| 2010/0260370 | A1* | 10/2010 | Chen et al. .................. 381/386 |

FOREIGN PATENT DOCUMENTS

| | | | |
|---|---|---|---|
| EP | 599250 | A2 | 6/1994 |
| EP | 1763283 | A2 | 3/2007 |
| JP | S58-28500 | | 2/1983 |
| JP | 58-066798 | | 5/1983 |
| JP | H04-170897 | | 6/1992 |
| JP | H04-368099 | | 12/1992 |
| JP | 0511694 | | 2/1993 |
| JP | 06-098397 | | 4/1994 |
| JP | 06-161476 | | 6/1994 |
| JP | 2508675 | | 6/1996 |
| JP | 2007-074663 | | 3/2007 |
| JP | 2010-110001 | | 5/2010 |
| WO | 2006016443 | | 2/2006 |

OTHER PUBLICATIONS

Chinese Office Action, dated Feb. 25, 2015, in corresponding Chinese Patent Application No. 201180061380.4.

Japanese Official Action dated Oct. 6, 2015; Appln. No. 2012-550687.

* cited by examiner

OSCILLATION DEVICE AND ELECTRONIC APPARATUS

TECHNICAL FIELD

The present invention relates to an oscillation device and an electronic apparatus.

BACKGROUND ART

The development of thin stylish cellular phones having sound functions such as music reproduction or a hands-free function as commodity values has been actively conducted. In this situation, there is strong demand for electro-acoustic transducers that are made small and thin and that has a high-quality sound. In addition, the development of thin piezoelectric electro-acoustic transducers to replace electrodynamic electro-acoustic transducers of the related art has been actively conducted. The piezoelectric electro-acoustic transducers reproduce a sound wave using an expansion and contraction motion of a piezoelectric element. For this reason, there is an advantage in a reduction in the thickness thereof as compared to an electrodynamic electro-acoustic transducer constituted by a magnet or a voice coil.

At present, various types of electro-acoustic transducers described above have been proposed (Patent Documents 1 to 3).

RELATED DOCUMENT

Patent Document

[Patent Document 1] Japanese Unexamined Utility Model Registration Publication No. S58-028500
[Patent Document 2] Japanese Unexamined Patent Publication No. H04-170897
[Patent Document 3] Japanese Unexamined Patent Publication No. H04-368099

DISCLOSURE OF THE INVENTION

In recent years, there is increasing demand for cellular phones having a waterproof structure, and electro-acoustic transducers for cellular phones are required to have a waterproof structure. A piezoelectric element serving as a driving source of a piezoelectric electro-acoustic transducer is constituted by a piezoelectric substance of which upper and lower principal surfaces are constrained by an electrode material. Since a general piezoelectric electro-acoustic transducer has a structure in which a vibrating member is bonded to the piezoelectric element, even when any one of the vibrating member and the piezoelectric element faces a sound hole, the piezoelectric electro-acoustic transducer has a row water resistance.

The invention is contrived in view of such circumstances, and an object thereof is to provide a piezoelectric oscillation device having a waterproof structure, and an electronic apparatus that has a waterproof structure and uses the oscillation device.

An oscillation device of the invention includes an oscillation element that has a vibrating member and a piezoelectric element that is attached to one surface of the vibrating member; a sheet-shaped waterproof member that is constituted by a waterproof material; a frame-shaped supporting member that holds an outer peripheral portion of the vibrating member and an outer peripheral portion of the waterproof member so that the waterproof member and the oscillation element face each other; and a connection member that partially connects mutual opposed surfaces of the oscillation element and the waterproof member.

An electronic apparatus of the invention includes a housing; a sound hole that is provided in the housing; and an oscillation device that is provided inside the housing. The oscillation device includes: an oscillation element that includes a vibrating member, and a piezoelectric element that is attached to one surface of the vibrating member; a sheet-shaped waterproof member that is constituted by a waterproof material; a frame-shaped supporting member that holds an outer peripheral portion of the vibrating member and an outer peripheral portion of the waterproof member so that the waterproof member and the oscillation element face each other; and a connection member that partially connects mutual opposed surfaces of the oscillation element and the waterproof member. The supporting member is bonded to an inner surface of the housing so as to surround the sound hole in a direction in which the waterproof member faces the sound hole.

In the oscillation device of the invention, the vibration of at least one of the vibrating member and the piezoelectric element is transmitted via the connection member to the sheet-shaped waterproof member of which the outer peripheral portion is supported by the frame-shaped supporting member. For this reason, since the waterproof member vibrates together with the piezoelectric element or the vibrating member that oscillates, the waterproof member can oscillate ultrasonic waves. In the waterproof member, the outer peripheral portion is supported by the frame-shaped supporting member, and the vibrating member or the piezoelectric element is disposed on one side based on the waterproof member, and thus the vibrating member and the piezoelectric element can be waterproofed by the waterproof member.

BRIEF DESCRIPTION OF THE DRAWINGS

The above-described objects, other objects, features and advantages will be further apparent from the preferred embodiments described below, and the accompanying drawings as follows.

DESCRIPTION OF EMBODIMENTS

Figure 1:
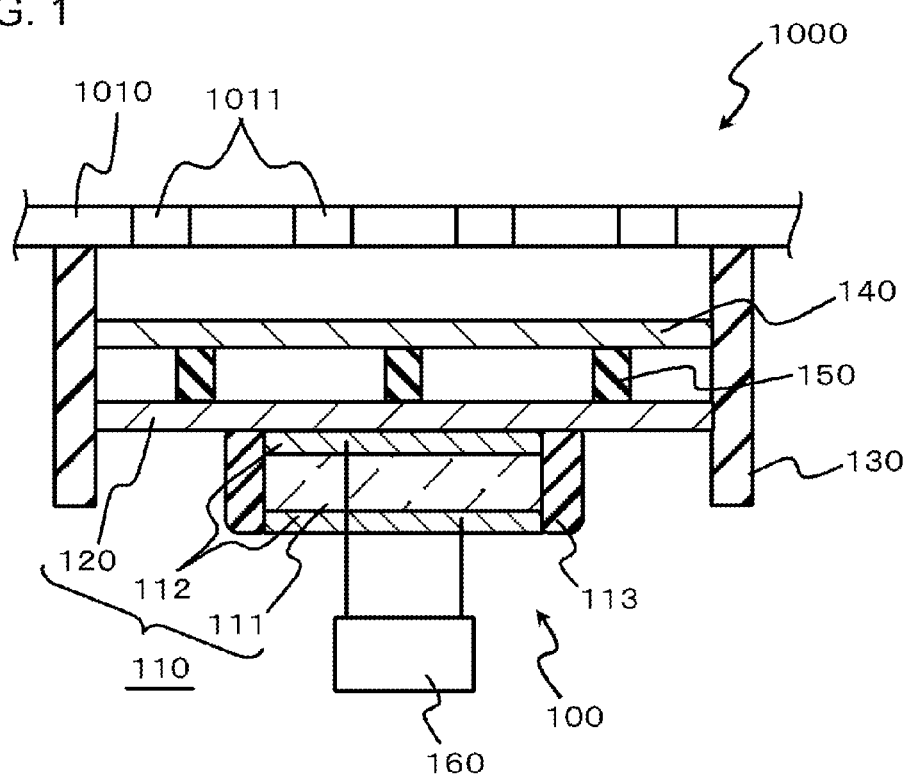
FIG. 1 is a schematic vertical cross-sectional front view illustrating a structure of an electro-acoustic transducer which is an oscillation device according to an embodiment of the invention.

Hereinafter, an electro-acoustic transducer 100 which is an oscillation device of the embodiment will be described with reference to FIG. 1. As illustrated in FIG. 1, the electro-acoustic transducer 100 of the embodiment includes an oscillation element 110 having a vibrating member 120 and a piezoelectric element 111 that is attached to one surface of the vibrating member 120. The electro-acoustic transducer 100 further includes a sheet-shaped waterproof member 140 that is constituted by a waterproof material. The electro-acoustic transducer 100 further includes a frame-shaped supporting member 130 that holds an outer peripheral portion of the vibrating member 120 and an outer peripheral portion of the waterproof member 140 so that the waterproof member 140 and the oscillation element 110 face each other. The electro-acoustic transducer 100 further includes a connection member 150 that partially connects mutual opposed surfaces of the oscillation element 110 and the waterproof member 140.

In more detail, in the electro-acoustic transducer 100 of the embodiment, the vibrating member 120 and the waterproof member 140 face each other, and the connection member 150 connects the vibrating member 120 and the waterproof member 140. In addition, the supporting member 130 protrudes in a direction opposite to the vibrating member 120 based on the waterproof member 140. The supporting member 130 is bonded to an inner surface of a housing 1010 so as to surround sound holes 1011 in a direction in which the waterproof member 140 faces the sound holes 1011 of the housing 1010.

The vibrating member 120 is held by the supporting member 130 by causing the outer peripheral portion thereof to be bonded to an inner peripheral surface of the supporting member 130.

The waterproof member 140 is held by the supporting member 130 by causing the outer peripheral portion thereof to be bonded to the inner peripheral surface of the supporting member 130. For example, the entirety of the outer peripheral portion of the waterproof member 140 is bonded to the inner peripheral surface of the supporting member 130. However, a gap (enough to secure water-tightness between the outer peripheral portion of the waterproof member 140 and the inner peripheral surface of the supporting member 130) enough to maintain a waterproof performance by surface tension may be formed between the outer peripheral portion of the waterproof member 140 and the inner peripheral surface of the supporting member 130. In addition, in the electro-acoustic transducer 100 of the embodiment, a plurality of the connection members 150 are provided so as to be spaced apart from each other.

The plane of the vibrating member 120 is larger in size than that of the piezoelectric element 111. The piezoelectric element 111 is disposed at a position that avoids the outer peripheral portion of the vibrating member 120. For example, the piezoelectric element 111 is disposed in the center portion of the vibrating member 120.

The plane of the waterproof member 140 may be larger in size than that of the vibrating member 120, or may have the same size as that of the vibrating member 120.

An electronic apparatus 1000 of the embodiment includes the housing 1010, the sound holes 1011 provided in the housing 1010, and the electro-acoustic transducer 100 provided inside the housing 1010. The electro-acoustic transducer 100 includes the oscillation element 110 having the vibrating member 120 and the piezoelectric element 111 that is attached to one surface of the vibrating member 120. The electro-acoustic transducer 100 further includes the sheet-shaped waterproof member 140 constituted by a waterproof material, the frame-shaped supporting member 130 that holds the outer peripheral portion of the vibrating member 120 and the outer peripheral portion of the waterproof member 140 so that the waterproof member 140 and the oscillation element 110 face each other, and the connection member 150 that partially connects the mutual opposed surfaces of the oscillation element 110 and the waterproof member 140. The supporting member 130 is bonded to the inner surface of the housing 1010 so as to surround the sound holes 1011 in a direction in which the waterproof member 140 faces the sound holes 1011.

Therefore, the oscillation element 110 including the vibrating member 120 and the piezoelectric element 111 is positioned at the inner side of the housing 1010 than the waterproof member 140, and thus the oscillation element 110 is waterproofed by the waterproof member 140.

In addition, the electronic apparatus 1000 of the embodiment includes a driver circuit 160 which is an oscillation driving unit that inputs a modulation signal for driving the electro-acoustic transducer 100 as a parametric speaker to the piezoelectric element 111.

More specifically, the piezoelectric element 111 is formed in a flat plate shape, and moves expansively and contractively through the application of an electric field. The vibrating member 120 has a larger diameter than the piezoelectric element 111, is formed so as to be flat, and constrains one surface of the piezoelectric element 111. The waterproof member 140 is flat and is positioned in parallel with the vibrating member 120. The piezoelectric element 111 is constrained by the one surface of the vibrating member 120, and the waterproof member 140 is connected to the other surface of the vibrating member 120 with the connection member 150 interposed therebetween.

One end of the supporting member 130 is bonded to the inner surface of the housing 1010 so that water-tightness between the one end of the supporting member 130 and the inner surface of the housing 1010 is secured.

In the electro-acoustic transducer 100 of the embodiment, the planar shapes of the piezoelectric element 111, the vibrating member 120, the waterproof member 140, and the supporting member 130 may be circular or rectangular, for example, square. In more detail, an electrode layer 112 is formed on each of both surfaces of the piezoelectric element 111, and an insulating layer 113 is formed in the outer peripheral portion of the piezoelectric element 111. The oscillation element 110 is formed by the electrode layer 112, the piezoelectric element 111, the insulating layer 113, and the vibrating member 120, and the driver circuit 160 which is an oscillation driving unit is electrically connected to the oscillation element 110.

Meanwhile, the material of the piezoelectric element 111 is not particularly limited to an inorganic material and an organic material as long as it is a material having a piezoelectric effect. However, the material may be a material having a high electro-mechanical conversion efficiency, for example, lead zirconate titanate (PZT) or barium titanate ($BaTiO_3$).

In addition, the thickness of the piezoelectric element 111 is not particularly limited, but is preferably equal to or more than 10 μm and equal to or less than 500 μm. When a thin film formed of, for example, a ceramic material which is a brittle material, having a thickness of less than 10 μm is used as the piezoelectric element 111, a crack and damage occurs due to the weakness of mechanical strength during handling, and thus it is difficult to handle the thin film. In addition, when ceramic having a thickness of over 500 μm is used as the piezoelectric element 111, energy conversion efficiency in which electrical energy is converted into mechanical energy considerably decreases, and thus it is not likely to obtain a sufficient performance as a speaker unit.

Generally, in a piezoelectric ceramic that generates an electrostrictive effect through an input of an electrical signal, the energy conversion efficiency depends on an electric field intensity. Since the electric field intensity is represented by a thickness/input voltage with respect to a polarization direction, there is a problem in that an increase in thickness inevitably results in a decrease in energy conversion efficiency. The electrode layer 112 is formed on each of principal surfaces of the both surfaces of the piezoelectric element 111 of the invention in order to generate an electric field.

In addition, the thickness of the electrode layer 112 is not particularly limited, but is preferably 1 to 100 μm. In the thickness of less than 1 μm, it is not possible to uniformly form the electrode layer 112 because the electrode layer 112 has a thin film thickness, and thus there is a possibility of the energy conversion efficiency decreasing. In addition, when the film thickness of the electrode layer 112 exceeds 100 μm, there is no particular manufacturing problem, but the electrode layer 112 serves as a constraint surface with respect to the piezoelectric element 111, and thus there is a problem in that the energy conversion efficiency decreases.

The material constituting the vibrating member 120 is not particularly limited as long as it is a material, such as a metal or a resin, having a high elastic modulus with respect to ceramic which is a brittle material, but is preferably phosphor bronze, stainless steel, or the like from the viewpoint of workability or costs. In addition, the thickness of the vibrating member 120 is preferably 5 to 1000 μm. When the thickness of the vibrating member 120 is less than 5 μm, there are problems in that a function of the vibrating member as a constraint member is damaged due to a low mechanical strength, and that variation in the machinery vibration feature of a vibrator occurs between production lots due to a reduction in processing accuracy.

In addition, the connection members 150 have a shape and are arranged in such a manner that the vibration of the vibrating member 120 oscillating together with the oscillation element 110 is transmitted to the waterproof member 140 with a high efficiency. For example, the connection members 150 are formed in the form of a pillar that connects the vibrating member 120 and the waterproof member 140 at a plurality of positions, and are arranged on the outside of four corners and in the center of the oscillation element 110.

A mechanism for generating a sound wave uses an expansion and contraction motion occurring by an electric field being applied to the piezoelectric element 111. In addition, a frequency of ultrasonic waves is limited to equal to or more than 20 kHz. Since the piezoelectric element 111 has a high mechanical quality factor Q, energy is concentrated in the vicinity of a fundamental resonance frequency. For this reason, although a high sound pressure level can be obtained in the fundamental resonance frequency band, sound pressure attenuates in other frequency bands.

Since the electro-acoustic transducer 100 of the embodiment oscillates ultrasonic waves limited to a specific frequency, the electro-acoustic transducer has an advantage as a feature that a mechanical quality factor Q of the piezoelectric element 111 is high. In addition, since a fundamental resonance frequency of the oscillation element 110 is affected by the shape of the piezoelectric element 111, when a resonance frequency is adjusted to a high frequency band, for example, an ultrasonic wave band, the electro-acoustic transducer 100 has an advantage in miniaturization.

Meanwhile, the electro-acoustic transducer 100 of the embodiment performs sound reproduction on the basis of a so-called parametric speaker principle that oscillates ultrasonic waves on which FM (Frequency Modulation) or AM (Amplitude Modulation) is performed and that demodulates a modulation wave using a non-linear state (sparse and dense state) of air to reproduce an audible sound. In the electro-acoustic transducer 100 of the embodiment, the piezoelectric element 111 has a configuration limited to the oscillation of a high frequency band, and thus the miniaturization of the electro-acoustic transducer 100 is possible.

According to the above-described configuration, in the electro-acoustic transducer 100 of the embodiment, the vibration of the piezoelectric element 111 is transmitted to the sheet-shaped waterproof member 140 of which the outer peripheral portion is supported by the frame-shaped supporting member 130 from the vibrating member 120 through the connection members 150.

For this reason, since the waterproof member 140 vibrates together with the piezoelectric element 111 and the vibrating member 120 that oscillate, the waterproof member 140 can oscillate ultrasonic waves. The outer peripheral portion of the waterproof member 140 is supported by the frame-shaped supporting member 130, and the vibrating member 120 and the piezoelectric element 111 are disposed on one side (the lower side in FIG. 1) based on the waterproof member 140, and thus the vibrating member 120 and the piezoelectric element 111 can be waterproofed by the waterproof member 140.

Moreover, in the electro-acoustic transducer 100 of the embodiment, an end of the electro-acoustic transducer 100 on which stress is concentrated during vibration is constituted by the waterproof member 140 that is rich in flexibility. In other words, since striking energy at the time of drop can be absorbed by the waterproof member 140, drop strength increases.

Further, in the electro-acoustic transducer 100 of the embodiment, the driving force (vibration) of the piezoelectric element 111 is transmitted to the waterproof member 140 through the connection members 150 to oscillate a sound wave. Here, the vibration can be transmitted (propagated) by the connection members 150 having an arbitrary shape. It is possible to avoid extra stress dispersion during the vibration by disposing the connection members 150 as transmission members in only locations of the piezoelectric element 111 and the vibrating member 120 on which stress is concentrated, and thus a vibration transmission efficiency is improved and a sound pressure level increases.

The electro-acoustic transducer 100 having such a configuration can oscillate not only in an audible band but also in an ultrasonic wave band. In other words, the electro-acoustic transducer 100 can also be applied to a parametric speaker that uses ultrasonic waves as carrier waves of a sound. In such a configuration, the rigidity of the vibrating member 120 and the waterproof member 140 is appropriately set, and thus adjustment to an arbitrary fundamental resonance frequency can be made. Therefore, a vibrator for ultrasonic waves can be easily formed.

Meanwhile, the invention is not limited to the embodiment, and allows various modifications thereof without departing from the scope of the invention. For example, in the above-described embodiment, the example has been described in which the piezoelectric element 111 is constrained by one surface of the vibrating member 120, and the waterproof member 140 is connected to the other surface of the vibrating member 120 with the connection members 150 interposed therebetween.

Figure 2:
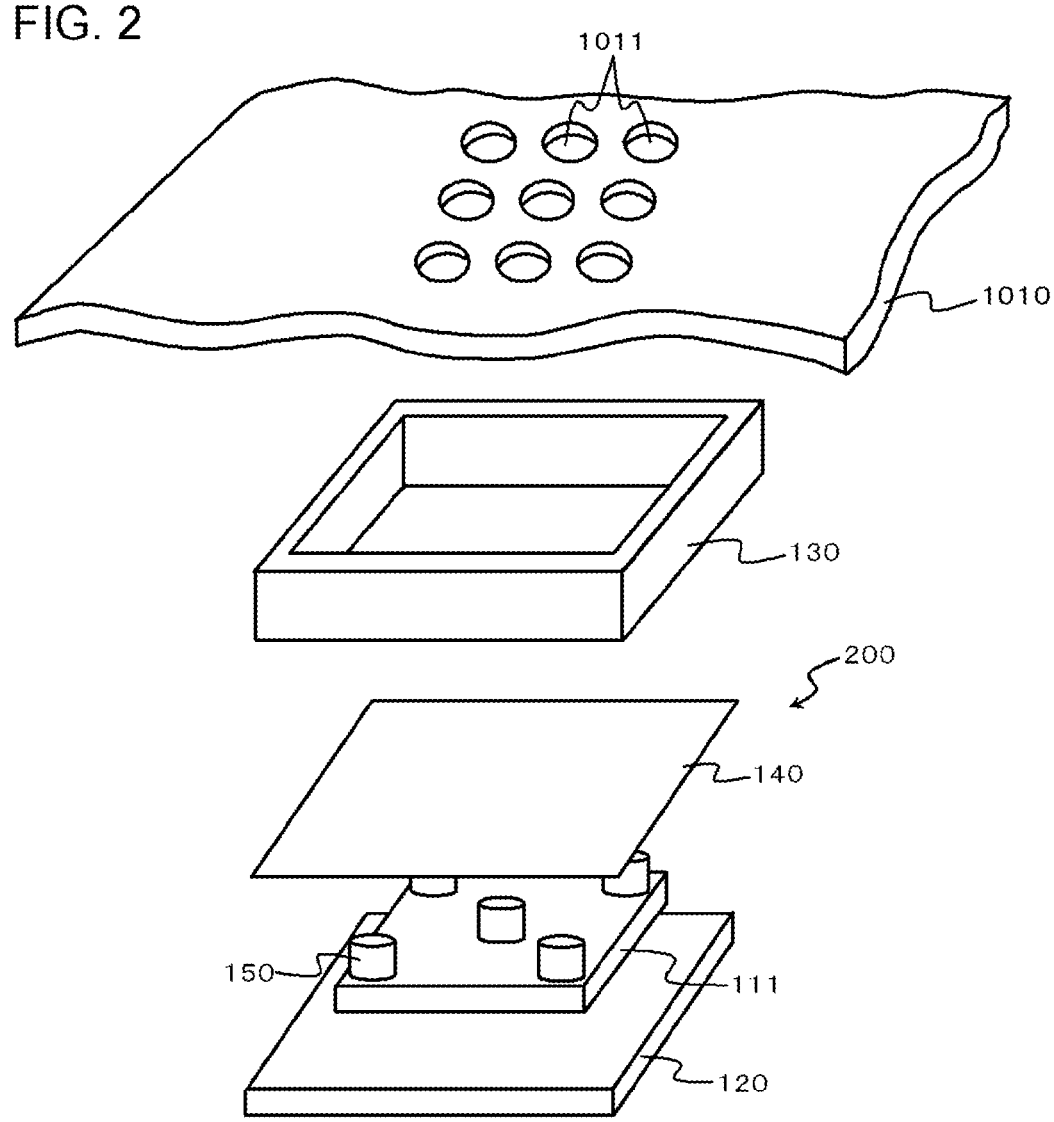
FIG. 2 is a schematic exploded perspective view illustrating a structure of an electro-acoustic transducer which is an oscillation device according to a modified example.
Figure 3:
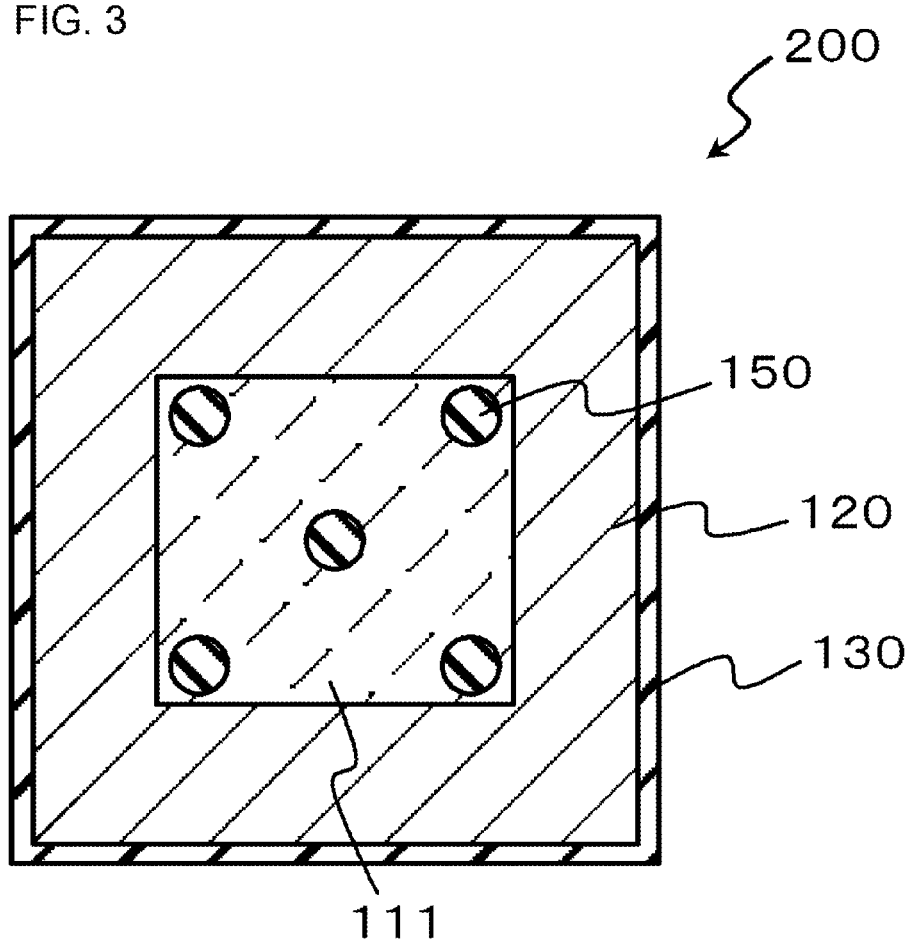
FIG. 3 is a schematic horizontal cross-sectional plan view illustrating a structure of the electro-acoustic transducer.

However, like an electro-acoustic transducer 200 illustrated as the oscillation device in FIGS. 2 and 3, one surface of the piezoelectric element 111 may be constrained by the vibrating member 120, and the other surface of the piezoelectric element 111 may be connected to the waterproof member 140 with the connection members 150 interposed therebetween.

In addition, in the above-described embodiment, the example has been described in which the vibrating member 120 and the waterproof member 140 face each other, and the connection members 150 connect the vibrating member 120 and the waterproof member 140 to each other. However, like an electro-acoustic transducer 400 illustrated as the oscillation device in FIG. 4, the piezoelectric element 111 (the piezoelectric element 111 on the upper side of FIG. 4) and the waterproof member 140 may face each other, and the connection members 150 may connect the piezoelectric element 111 (the piezoelectric element 111 on the upper side of FIG. 4) and the waterproof member 140.

Figure 4:
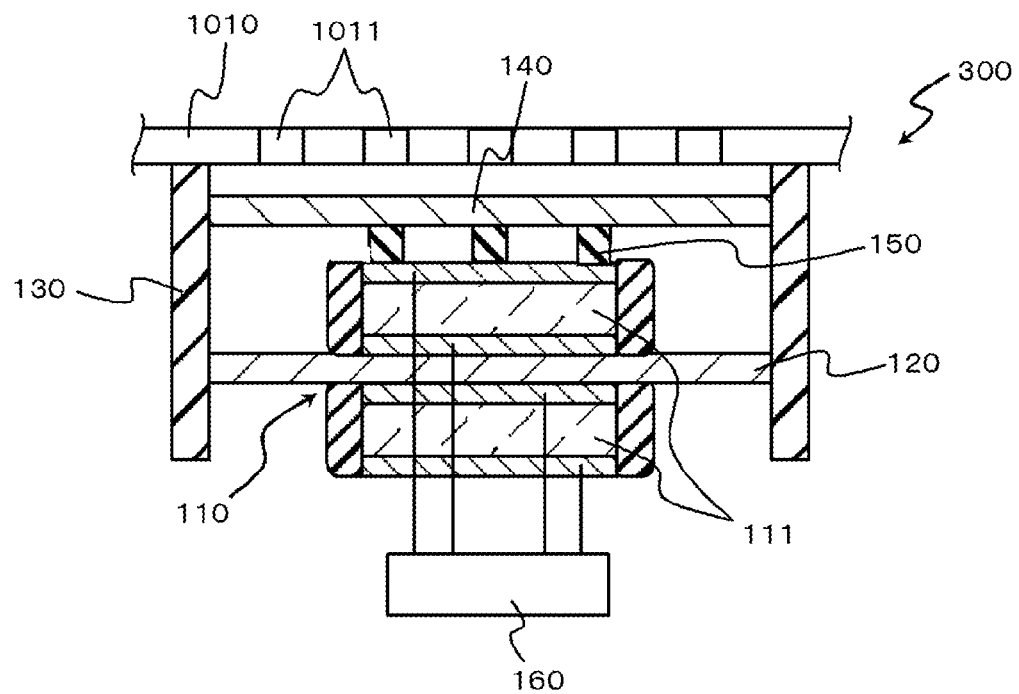
FIG. 4 is a schematic vertical cross-sectional front view illustrating a structure of an electro-acoustic transducer which is an oscillation device according to another modified example.

Further, like an electro-acoustic transducer 300 illustrated as the oscillation device in FIG. 4, the electro-acoustic transducer may have the piezoelectric element 111 attached to one surface of the vibrating member 120 and a second piezoelectric element 111 attached to the other surface of the vibrating member 120. In this case, since the electro-acoustic transducer 300 functions as a parametric speaker having a bimorph structure, the output thereof increases.

In addition, the oscillation element 110 and the connection members 150 may be arranged on the surface of the vibrating member 120, and the connection members 150 may be connected to the rear surface of the waterproof member 140 (not shown).

Further, in the above-described embodiment, although a single-layered piezoelectric ceramic is assumed as the piezoelectric element 111, the piezoelectric element may have a structure in which a plurality of piezoelectric ceramics and a plurality of the electrode layers 112 are stacked thereon (not shown).

Figure 5:
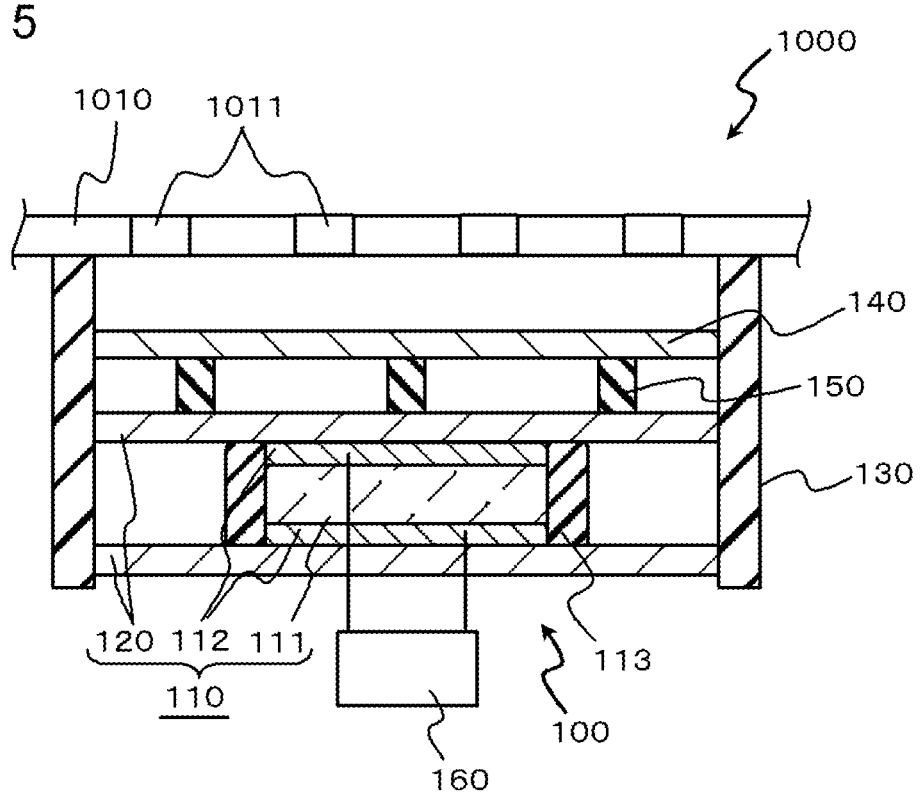
FIG. 5 is a schematic vertical cross-sectional front view illustrating a structure of an electro-acoustic transducer which is an oscillation device according to further another modified example.

Further, in the above-described embodiment, the example has been described in which the vibrating member 120 faces the waterproof member 140, and the connection members 150 connect the vibrating member 120 and the waterproof member 140 to each other. However, like the electro-acoustic transducer 400 illustrated as the oscillation device in FIG. 5, the electro-acoustic transducer may have a second vibrating member 120 that is disposed on the opposite side of the vibrating member 120 with the piezoelectric element 111 interposed therebetween and that is attached to the piezoelectric element 111.

In addition, in the above-described embodiment, the electronic apparatus is assumed in which the driver circuit 160 serving as an oscillation driving unit is connected to the electro-acoustic transducer 100. However, it is also possible to implement an electronic apparatus (not shown) such as a sonar including the electro-acoustic transducer 100, an oscillation driving unit that causes the electro-acoustic transducer 100 to output ultrasonic waves, an ultrasonic wave detection unit that detects ultrasonic waves that are oscillated from the electro-acoustic transducer 100 and are reflected by an object to be measured, and a distance measurement unit that measures a distance to the object to be measured on the basis of the detected ultrasonic waves.

Meanwhile, as a matter of course, the above-described embodiments and the above-described modified examples can be combined within a range in which contents thereof do not conflict with each other. Additionally, in the above-described embodiments and the above-described modified examples, a structure and the like of each component have been described in detail, but the structure and the like can be changed in various ways within a range satisfying the invention.

The above-described embodiment includes the following technical ideas.

(1) An oscillation device including:
an oscillation element that includes a vibrating member and a piezoelectric element that is attached to one surface of the vibrating member;
a supporting member that holds an outer peripheral portion of the vibrating member and of which an end protrudes further than the oscillation element;
a sheet-shaped waterproof member of which an outer peripheral portion is bonded to a portion positioned on the end side rather than the oscillation element in the supporting member, and that is constituted by a material having a waterproof property; and
a connection member that connects a part of a surface facing the waterproof member in the oscillation element to the waterproof member.

(2) The oscillation device according to (1), wherein the vibrating member of the oscillation element faces the waterproof member, and the connection member connects the vibrating member and the waterproof member.

(3) The oscillation device according to (2), further including a second vibrating member that is positioned on the opposite side of the vibrating member with the piezoelectric element interposed therebetween and that is attached to the piezoelectric element.

(4) The oscillation device according to (1), wherein the piezoelectric element of the oscillation element faces the waterproof member, and the connection member connects the piezoelectric element and the waterproof member to each other.

(5) The oscillation device according to (4), further including a second piezoelectric element that is positioned on the opposite side of the piezoelectric element with the vibrating member interposed therebetween and that is attached to the vibrating member.

(6) The oscillation device according to any one of (1) to (5), wherein an end of the supporting member which is positioned on the opposite side of the vibrating member protrudes further than the waterproof member.

(7) The oscillation device according to any one of (1) to (6), wherein the supporting member is bonded to the entirety of an outer peripheral portion of the waterproof member.

(8) The oscillation device according to any one of (1) to (7), wherein a plurality of the connection members are provided so as to be spaced apart from each other.

(9) An electronic apparatus including:
a housing;
a sound hole that is provided in the housing; and
an oscillation device that is provided at a position facing the sound hole inside the housing,
wherein the oscillation device includes:
a vibrating member;
a piezoelectric element that is attached to one surface of the vibrating member;
a sheet-shaped waterproof member that is attached to the other surface of the vibrating member, that has a planar shape larger than the vibrating member, and that is constituted by a material having a waterproof property; and
a supporting member that is bonded to an outer peripheral portion of the waterproof member, and
wherein the supporting member is bonded to an inner surface of the housing so as to surround the sound hole in a direction in which the waterproof member faces the sound hole.

(10) The electronic apparatus according to (9), further comprising an oscillation driving unit that inputs a modulation signal for driving the oscillation device as a parametric speaker to the piezoelectric element.

The application claims the priority based on Japanese Patent Application No. 2010-291873 filed on Dec. 28, 2010, the content of which is incorporated herein by reference.

The invention claimed is:

1. An oscillation device comprising:
   an oscillation element that has a vibrating member and a piezoelectric element that is attached to one surface of the vibrating member;
   a sheet-shaped waterproof member that is constituted by a waterproof material;
   a frame-shaped supporting member that holds an outer peripheral portion of the vibrating member and an outer peripheral portion of the sheet-shaped waterproof member so that the sheet-shaped waterproof member and the oscillation element face each other; and
   a connection member that partially connects mutually opposed surfaces of the oscillation element and the sheet-shaped waterproof member,
   wherein the entirety of the outer peripheral portion of the sheet-shaped waterproof member is bonded to an inner peripheral surface of the frame-shaped supporting member.

2. The oscillation device according to claim 1, wherein the vibrating member and the sheet-shaped waterproof member face each other, and the connection member connects the vibrating member and the sheet-shaped waterproof member to each other.

3. The oscillation device according to claim 2, further comprising a second vibrating member that is positioned on the opposite side of the vibrating member with the piezoelectric element interposed therebetween and that is attached to the piezoelectric element.

4. The oscillation device according to claim 1, wherein the piezoelectric element and the sheet-shaped waterproof member face each other, and the connection member connects the piezoelectric element and the sheet-shaped waterproof member to each other.

5. An oscillation device comprising:
   an oscillation element that has a vibrating member and a piezoelectric element that is attached to one surface of the vibrating member;
   a sheet-shaped waterproof member that is constituted by a waterproof material;
   a frame-shaped supporting member that holds an outer peripheral portion of the vibrating member and an outer peripheral portion of the sheet-shaped waterproof member so that the sheet-shaped waterproof member and the oscillation element face each other;
   a connection member that partially connects mutual opposed surfaces of the oscillation element and the sheet-shaped waterproof member; and
   a second piezoelectric element that is attached to the other surface of the vibrating member,
   wherein the piezoelectric element and the sheet-shaped waterproof member face each other, and the connection member connects the piezoelectric element and the sheet-shaped waterproof member to each other.

6. The oscillation device according to claim 1, wherein the frame-shaped supporting member protrudes in a direction opposite to the vibrating member based on the sheet-shaped waterproof member.

7. The oscillation device according to claim 1, wherein a plurality of the connection members are provided so as to be spaced apart from each other.

8. An electronic apparatus comprising:
   a housing;
   a sound hole that is provided in the housing; and
   an oscillation device that is provided inside the housing,
   wherein the oscillation device includes:
   an oscillation element that includes a vibrating member, and a piezoelectric element that is attached to one surface of the vibrating member;
   a sheet-shaped waterproof member that is constituted by a waterproof material;
   a frame-shaped supporting member that holds an outer peripheral portion of the vibrating member and an outer peripheral portion of the sheet-shaped waterproof member so that the sheet-shaped waterproof member and the oscillation element face each other; and
   a connection member that partially connects mutual opposed surfaces of the oscillation element and the sheet-shaped waterproof member, and
   wherein the frame-shaped supporting member is bonded to an inner surface of the housing so as to surround the sound hole in a direction in which the sheet-shaped waterproof member faces the sound hole.

9. The electronic apparatus according to claim 8, further comprising an oscillation driving unit that inputs a modulation signal for driving the oscillation device as a parametric speaker to the piezoelectric element.

* * * * *